(12) United States Patent  (10) Patent No.: US 8,132,996 B2
Hügler  (45) Date of Patent: *Mar. 13, 2012

(54) GATE VALVE AND SUBSTRATE-TREATING APPARATUS INCLUDING THE SAME

(75) Inventor: Klaus Hügler, Kirchbergstr.1 (DE)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/794,745

(22) Filed: Jun. 6, 2010

(65) Prior Publication Data

US 2010/0239395 A1  Sep. 23, 2010

Related U.S. Application Data

(63) Continuation of application No. 11/467,492, filed on Aug. 25, 2006, now Pat. No. 7,771,150.

(30) Foreign Application Priority Data

Aug. 26, 2005 (DE) ............................... 2005-040741
Jun. 12, 2006 (KR) ................................ 2006-52511

(51) Int. Cl.
 *H01L 21/677* (2006.01)
(52) U.S. Cl. .......................... 414/217; 414/939; 414/940
(58) Field of Classification Search .................. 414/217, 414/939, 940
See application file for complete search history.

(56) References Cited

U.S. PATENT DOCUMENTS

| 2,676,780 | A |   | 2/1989 | Wheatley |
| 5,364,219 | A |   | 11/1994 | Takahashi et al. |
| 5,980,183 | A | * | 11/1999 | Fosnight ................. 414/222.01 |
| 6,273,664 | B1 |   | 8/2001 | Doche |
| 6,393,716 | B1 |   | 5/2002 | Chang et al. |
| 6,517,304 | B1 |   | 2/2003 | Matsumoto |
| 6,817,593 | B2 |   | 11/2004 | Kato et al. |
| 6,837,663 | B2 |   | 1/2005 | Mages et al. |
| 2002/0024611 | A1 |   | 2/2002 | Watanabe et al. |
| 2003/0053894 | A1 |   | 3/2003 | Matsumoto |

FOREIGN PATENT DOCUMENTS

| EP | 0574893 | 12/1993 |
| EP | 574893 A2 | 12/1993 |
| WO | 9918603 | 4/1994 |
| WO | 9738440 | 10/1997 |
| WO | 2004102055 | 11/2004 |

* cited by examiner

*Primary Examiner* — Gregory Adams
*Assistant Examiner* — Jonathan Snelting
(74) *Attorney, Agent, or Firm* — Portland IP Law LLC

(57) ABSTRACT

A substrate-treating apparatus includes: a plurality of modules disposed along a first direction, each of the plurality of modules having an inner space for containing a substrate; a transfer unit transferring the substrate among the plurality of modules, the transfer unit including at least one track disposed along the first direction and at least one movable transfer chamber moving along the at least one track; and a gate valve fixed to each of the plurality of modules and combined with the at least one movable transfer chamber. The at least one movable transfer chamber is isolated from an exterior atmosphere while moving.

18 Claims, 8 Drawing Sheets

GATE VALVE AND SUBSTRATE-TREATING APPARATUS INCLUDING THE SAME

CROSS-REFERENCE TO RELATED APPLICATION

This application is a Continuation application of U.S. application Ser. No. 11/467,492, filed Aug. 25, 2006, which claims priority to German Patent Application No. 10 2005 040 741.2 filed in Germany on Aug. 26, 2005 and Korean Patent Application No. 10-2006-0052511 filed in Korea on Jun. 12, 2006, which are hereby incorporated by references in their entirety.

BACKGROUND OF THE INVENTION

1. Technical Field

The present invention relates to a gate valve, and more particularly, to a gate valve for a large-sized substrate and a substrate-treating apparatus including the gate valve.

2. Discussion of the Related Art

Apparatuses for a semiconductor device have been widely developed. In U.S. patent application of publication No. US 2002/0024611, for example, a fabrication apparatus for a wafer having a diameter of 300 mm is disclosed. In the fabrication apparatus for a semiconductor device, a track for a transfer device is disposed in a central portion of a case, and a plurality of process stations are disposed along both sides of the track. The transfer device is supported by and moves along the track. In addition, a height of the transfer device is controllable, and the transfer device includes a substrate transfer means having a substrate holder. The substrate holder may be protruded to cross the track and use an arm assembly. The substrate transfer means is connected to the plurality of process stations having the wafer therein through the substrate holder.

The wafer is supplied to the transfer device from a transport box at front of the arm assembly. The fabrication apparatus is surrounded by a case, and the transport box is connected to the case. The transfer device is disposed among the plurality of process stations. Since a space surrounded by the case is isolated from the ambient air, the wafer transferred between the transfer device and the plurality of process stations is prevented from contamination.

However, a high vacuum for improving the isolation and contamination-preventing capacity of the case is limited by economical and structural conditions. The case has a structure whose an inner gas is slowly evacuated due to the pressure difference between the high vacuum space and the ambient air.

In addition, a possibility of transferring the substrate from the transport box to the space without contamination and a possibility of keeping a cleanness in the space while transferring the substrate through the transfer device are also limited. Specifically, the fabrication apparatus can not be applied to a large-sized substrate for a flat panel display (FPD). Since the large-sized substrate may have an area of a several square meters, the fabrication apparatus has an uncontrollable size. The fabrication apparatus for the large-sized substrate may have limitations in time and cost because it takes much time to obtain the high vacuum space for the large-sized substrate. Accordingly, the process time is lengthened and the fabrication cost increases.

SUMMARY

Accordingly, the present invention is directed to a gate valve and an apparatus including the gate valve that substantially obviates one or more of the problems due to limitations and disadvantages of the related art.

An object of the present invention is to provide a gate valve for a large-sized substrate and a substrate-treating apparatus including the gate valve that contains a large-sized substrate under a high vacuum condition.

Another object of the present invention is to provide a gate valve, a movable transfer chamber and a substrate-treating apparatus where a prompt docking between modules and a prompt transfer of a substrate between modules are obtained due to the gate valve.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate-treating apparatus includes: a plurality of modules disposed along a first direction, each of the plurality of modules having an inner space containable a substrate; a transfer unit transferring the substrate among the plurality of modules, the transfer unit including at least one track disposed along the first direction and at least one movable transfer chamber moving along the at least one track; and a gate valve fixed to each of the plurality of modules and combined with the at least one movable transfer chamber, wherein the at least one movable transfer chamber is atmospherically isolated from an exterior while moving.

Each of the plurality of modules includes a transfer hole, and the at least one movable transfer chamber includes an open portion corresponding to the transfer hole and a first valve opening and closing the open portion. In addition, the gate valve includes a second valve opening and closing the transfer hole and a blocking means corresponding to the first valve. The blocking means is disposed to overlap the first valve.

The gate valve includes a first path hole corresponding to the open portion, and the first valve is disposed in the first path hole. Further, the first valve moves between an open position and a close position by the blocking means, and the first valve includes a valve plate corresponding to the open portion. The blocking means includes a blocking plate rotatable in an inner space of the gate valve, and the blocking plate is disposed to overlap and contact the valve plate due to a pressure difference when the gate valve and the movable transfer chamber are combined. The blocking plate is disposed to overlap and contact the valve plate due to a magnet when the gate valve and the movable transfer chamber are combined. Moreover, the blocking plate rotates with respect to a rotation axis parallel to a connection surface of the gate valve and the movable transfer chamber in the inner space of the gate valve.

Each of the plurality of modules includes a transfer hole, and the at least one movable transfer chamber includes an open portion corresponding to the transfer hole and a first valve opening and closing the open portion. In addition, the gate valve includes a second valve opening and closing the transfer hole, a first blocking means corresponding to the first valve and a second blocking means corresponding to the second valve. The first and second blocking means include first and second blocking plates, respectively, rotatable in an inner space of the gate valve, and the second blocking plate is the second valve. The apparatus first and second blocking plates are disposed to overlap each other when the gate valve and the movable transfer chamber are combined. Further, the gate valve further includes a propping means supporting the first and second blocking plates to close the transfer hole and the open portion, and the propping means includes propping body having a sidewall corresponding to the first and second blocking plates. Moreover, the first and second blocking plates are supported by the propping means without direct contact. The sidewall of the propping body includes a plurality of first magnets and rear surfaces of the first and second blocking plates facing the sidewall include a plurality of second magnets, and the plurality of first magnets have an opposite polarity to the plurality of second magnets.

The at least one movable transfer chamber includes a first valve opening and closing the open portion and a lens at a boundary of the open portion facing the gate valve, and the gate valve includes a second valve opening and closing the transfer hole and a blocking means corresponding to the first valve. The lens is elastically supported by the movable transfer chamber. For example, the lens may be connected to the movable transfer chamber through a wrinkled connection means. The gate valve includes a first magnet of twofold, and the lens includes a second magnet corresponding to and having the same polarity as the second magnet. A gap portion between the lens and the gate valve is purged before and after the gate valve and the movable transfer chamber are combined, and the gap portion is purged using the blocking means.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
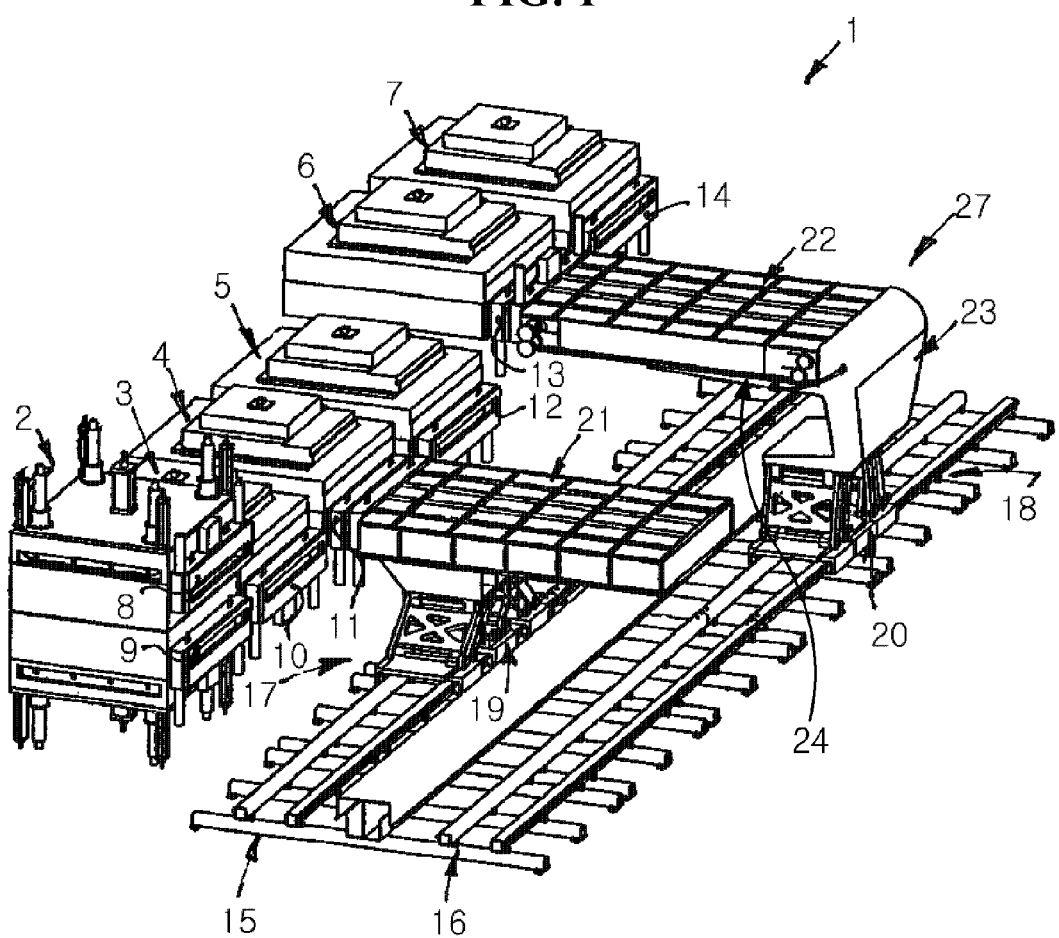
FIG. 1 is a perspective view showing a substrate-treating apparatus according to a first embodiment of the present invention.

Reference will now be made in detail to the preferred embodiments, examples of which are illustrated in the accompanying drawings.

In a substrate-treating apparatus according to the present invention, a substrate is transferred between modules with a minimized energy without breaking a pressure condition for a process in the modules using a gate valve. The gate valve may be fixed to one module and may be detachable from the other module. The gate valve includes a blocking means to close a path hole of the gate valve when the gate valve is detached from the module. The blocking means includes a blocking plate disposed to face a transfer hole of the detached module. In addition, the gate valve includes a supporting board for a valve plate in the case. Before the movable transfer chamber is connected to the gate valve, an isolated space defined by the supporting board is evacuated to eliminate contamination materials. Accordingly, the connection (docking) of the movable transfer chamber and the gate valve is performed without breaking the pressure condition, and the substrate is promptly transferred without contamination.

Since rotatable blocking plates are disposed on the opposite path holes of the gate valve, the structure of the gate valve is simplified and the speed of transferring a substrate increases. In addition, since the rotatable blocking plates are overlapped in the case, the volume of the gate valve is minimized. At the close position, the rotatable blocking plates are disposed to cover the path holes and supported by each other through a propping means. The propping means supports the blocking plates without direct contact using a magnet.

A lens is formed on the movable transfer chamber to prevent misalignment of the movable transfer chamber to the gate valve and obtain a prompt docking regardless of great volume and weight of the movable transfer chamber. The lens is elastically supported by the movable transfer chamber using a wrinkled connection means and contacts the gate valve independently. The movement of the movable transfer chamber toward the gate valve may be stopped by the lens. At the same time, the movable transfer chamber may be aligned to the gate valve using magnets without direct contact during the movement of the transfer chamber. The magnets are formed on the gate valve and the movable transfer chamber and have the same polarities. Accordingly, contamination due to friction of the gate valve and the movable transfer chamber is prevented.

A gap portion between the gate valve and the movable transfer module may be evacuated after the gate valve and the movable transfer chamber is connected. Before the evacuation, the gap portion may be purged by a clean gas supplied through the blocking plate to clean the lens. For these purpose, the blocking plate of the gate valve is spaced apart from the valve plate of the movable transfer chamber by the gap portion.

In addition, the transfer hole of the module may be covered with a valve. The valve includes a valve plate movable up and down. The valve plate is driven by a control means downwardly protruded from the gate valve. When the valve plate moves down, the blocking plate is disposed over a bottom of the gate valve. Accordingly, a volume of the gate valve may be minimized.

The gate valve is fixed to each of a plurality of modules and is detachable from the movable transfer chamber. The movable transfer chamber may be fixed to the gate valve using a pulling means.

When the gate valve and the movable transfer chamber are connected to each other, the open portion of the movable transfer chamber may be covered with the valve plate to keep a pressure condition in the movable transfer chamber. The valve plate may be fixed to the movable transfer chamber using a magnet because the movable transfer chamber has a lower pressure than exterior.

The propping means of the gate valve keeps the close position of the blocking plates. The gate valve is evacuated for the open position so that the path holes can be open and the blocking plates rotate to be disposed at the open position. A pumping unit for the evacuation may be combined to a shaft supporting the blocking plate.

FIG. 1 is a perspective view showing a substrate-treating apparatus according to a first embodiment of the present invention.

As shown in FIG. 1, a substrate-treating apparatus 1 includes first to sixth modules 2 to 7 and a transfer unit 27. The first to sixth modules 2 to 7 have first to sixth transfer holes 8 to 14, respectively, on a sidewall facing the transfer unit 27. The first module 2 has the first and second transfer holes 8 and 9. The transfer unit 27 includes first and second tracks 15 and 16. The first and second tracks 15 and 16 parallel to each other are disposed along the first to sixth modules 2 to 7. First and second transport units 17 and 18 are disposed over the first and second tracks 15 and 16, respectively. The first and second transport units 17 and 18 independently move, thereby moving along an opposite direction. As a result, the first and second transport units 17 and 18 may correspond to each of the first to sixth modules 2 to 7 independently. The first and second transport units 17 and 18 include first and second guide slides 19 and 20, respectively. The first and second guide slides 19 and 20 support first and second movable transfer chambers 21 and 22, respectively. The first and second guide slides 19 and 20 may move up and down to adjust height of the first and second movable transfer chambers 21 and 22. The first and second movable transfer chambers 21 and 22 may be connected to each of the first to sixth modules 2 to 7 through the first to seventh transfer holes 8 to 14 to obtain an airtight connection.

For example, the airtight connection between each of the first and second movable transfer chambers 21 and 22 and each of the first to sixth modules 2 to 7 may be obtained by extending a middle portion of each of the first and second movable transfer chambers 21 and 22 like a telescope. The middle portion of each of the first and second movable transfer chambers 21 and 22 may extend along a direction crossing the first and second tracks 15 and 16.

The first and second movable transfer chambers 21 and 22 may have a hexahedral shape corresponding to a size of a substrate. Even though not shown in FIG. 1, the first and second movable transfer chambers 21 and 22 may include a substrate holder having a metal band and a roller. A substrate may be supported and transferred by the substrate holder between each of the first and second movable transfer chambers 21 and 22 and each of the first to sixth modules 2 to 7. The substrate may be disposed on a mass band fitted to the metal band.

A connection means such as a stopping device or a valve that is one portion of packing means is formed at a front portion of each of the first and second movable transfer chambers 21 and 22 facing each of the first to seventh transfer holes 8 to 14. The airtight connection between each of the first and second movable transfer chambers 21 and 22 and each of the first to sixth modules 2 to 7 may be obtained by the connection means while the substrate is transferred. As a result, a pressure condition in each of the first and second movable transfer chambers 21 and 22 is kept for transferring the substrate. The pressure condition in each of the first and second movable transfer chambers 21 and 22 may be obtained when each of the first and second movable transfer chambers 21 and 22 is connected to the first module 2.

The first and second movable transfer chambers 21 and 22 has a volume containing a substrate having several square meters, thereby having a rectangular hexahedral shape. The first and second movable transfer chambers 21 and 22 cross the first and second tracks 15 and 16. The first movable transfer chamber 21 is supported to the first track 15 adjacent to the first to sixth modules 2 to 7 through the first guide slide 19. In addition, the second movable transfer chamber 22 is supported to the second track 16 farther from the first to sixth modules 2 to 7 through the second guide slide 20. Accordingly, the first movable transfer chamber 21 extends from the first guide slide 19 to the second track 16.

The second movable transfer chamber 22 is connected to the second guide slide 20 through a sub-carrier 23. The sub-carrier 23 includes a supporting plate 24 protruded to each of the first to sixth modules 2 to 7. The second movable transfer chamber 22 is disposed on the supporting plate 24 and extends to the first to sixth modules 2 to 7. The sub-carrier 23 and the guide slide 20 constitutes a U shaped path for the first movable transfer chamber 21. Accordingly, the first and second movable transfer chambers 21 and 22 are independently connected to or separated from the first to sixth modules 2 to 7 regardless of overlapped arrangement of the first and second transport units 17 and 18. Even when heights of the first and second guide slides 19 and 20 are adjustable or heights of the first to seventh transfer holes 8 to 14 are adjustable in another embodiment, the substrate-treating apparatus may include the sub-carrier 23 constituting a U shaped path.

In addition, a first air circulation space surrounding the first movable transfer chamber 21 may be atmospherically isolated from a second air circulation space surrounding the second movable transfer chamber 22 by the sub-carrier 23.

In this embodiment, the heights of the first and second guide slides 19 and 20 are not adjustable and fixed, and the first and second movable transfer chambers 21 and 22 have fixed heights. For example, the first to seventh transfer holes 8 to 14 may be classified into two groups having different heights, and the first and second movable transfer chambers 21 and 22 may correspond to the two groups of the first to seventh transfer holes 8 to 14, respectively. In addition, the first module 2 may be used as a transfer module and have the first and second transfer holes 8 and 9. The first and second transfer holes 8 and 9 having different heights correspond to the second and first movable transfer chambers 22 and 21, respectively. Further, the first and second transfer holes correspond to two groups of the third to seventh transfer holes 10 to 14, respectively. As a result, the first transfer hole 8 corresponds to the second movable transfer chamber 22, the sixth transfer hole 13 of the fifth module 6 and the seventh transfer hole 14 of the sixth module 7. In addition, the second transfer hole 9 corresponds to the first movable transfer chamber 21, the third transfer hole 10 of the second module 3, the fourth transfer hole 11 of the third module 4 and the fifth transfer hole 12 of the fourth module 5.

The first to sixth modules 2 to 7 may be arranged on the basis of a process time in each module. For example, when the first module 2 is used as a transfer module, the second to sixth modules 3 to 7 may be arranged such that a process time in a first module group including the fifth and sixth modules 6 and 7 is shorter than a process time in a module second group including the second to fourth modules 3 to 5. Accordingly, a total time including the process time and the transfer time for the farther first module group approaches a total time for the second module group. In addition, the heights of transfer holes of the first module group may be different from the heights of transfer holes of the second module group, thereby the first and second movable transfer chambers 21 and 22 corresponding to the second and first module groups, respectively.

The first and second movable transfer chambers 21 and 22 function as a vacuum chamber that transfers a substrate among the first to sixth modules 2 to 7 without breaking a vacuum. In addition, the vacuum of the first and second movable transfer chambers 21 and 22 may be obtained through the first module 2 as a transfer module.

Figure 2:
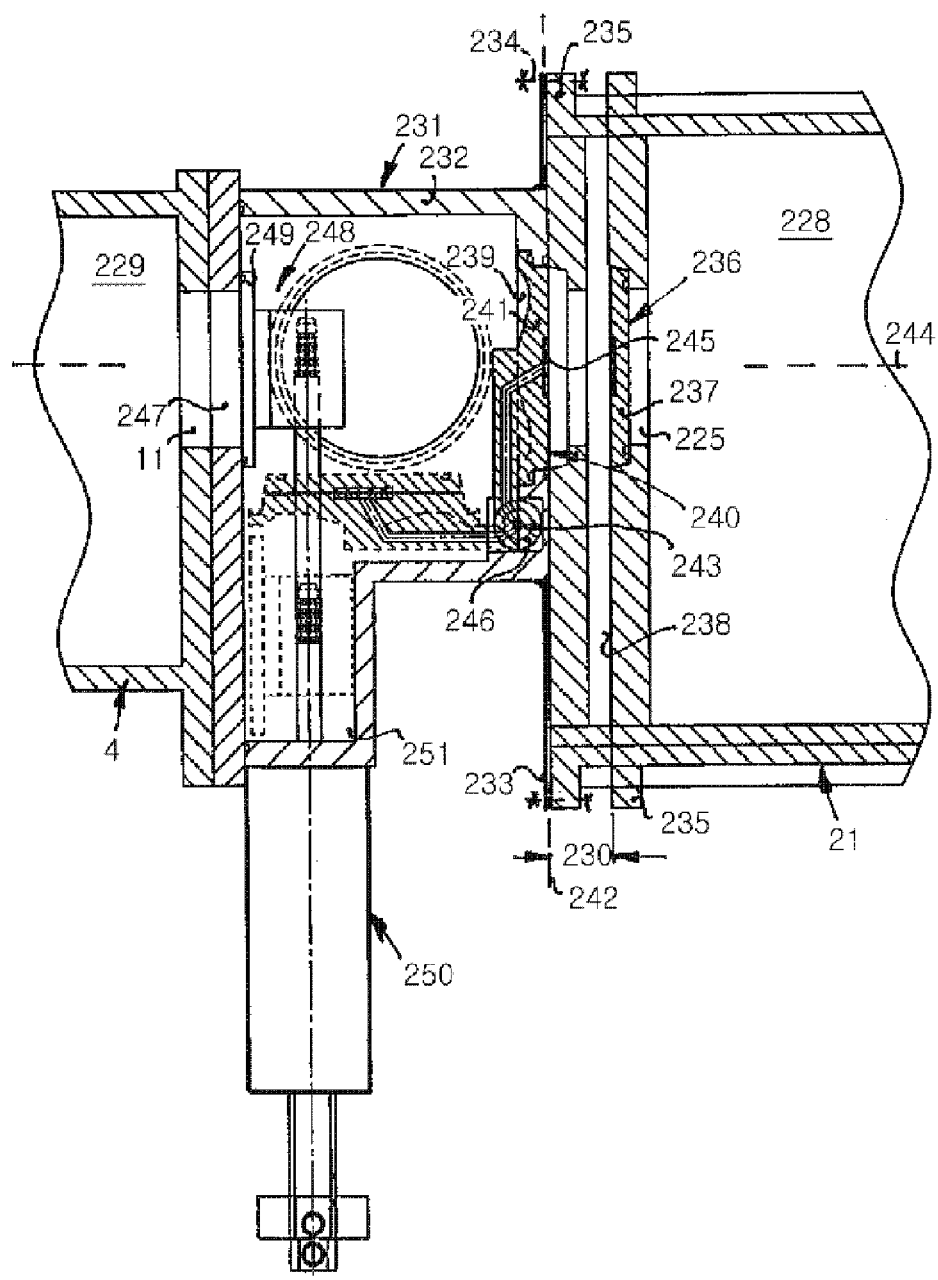
FIG. 2 is a cross-sectional view illustrating a docking operation of a module and a movable transfer chamber using a gate valve according to a second embodiment of the present invention.

FIG. 2 is a cross-sectional view illustrating a docking operation of a module and a movable transfer chamber using a gate valve according to a second embodiment of the present invention. For convenience of illustration, FIG. 2 shows close and open states of a third module 4 (of FIG. 1, which will be designated as "a module") representing a module unit of a substrate-treating apparatus and a first movable transfer chamber 21 (of FIG. 1, which will be designated as "a movable transfer chamber") representing a transfer unit of a substrate-treating apparatus. The docking operation may be applied to a connection between the other module and the other movable transfer chamber.

In FIG. 2, when a module 4 is connected to a movable transfer chamber 21, a space between the module 4 and the movable transfer chamber 21 is atmospherically isolated from exterior. Accordingly, a first inner space 229 of the module 4 and a second inner space 228 of the movable transfer chamber 21 are connected to each other through a transfer hole 11 of the module 4 and an open portion 225 of the movable transfer chamber 21 with atmospherically isolated from an ambient air.

Since the movable transfer chamber 21 is swayed with respect to a track 15 (of FIG. 1) by a gap distance 230 between the module 4 and the movable transfer chamber 21 due to elasticity, the module 4 and the movable transfer chamber 21 are connected to each other. The gap distance 230 may be determined by the movability of the movable transfer chamber 21 on the basis of tolerances for the module 4 and the movable transfer chamber 21. In another embodiment, however, the module and the movable transfer chamber may be connected to each other using an auxiliary connection means between the module and the movable transfer chamber even when the movable transfer chamber is not swayed toward the module. Moreover, in another embodiment, the movable transfer chamber that is swayed toward to the module may be connected to the module using an auxiliary connection means.

As a substrate is enlarged, a volume of a clean room and a case surrounding the whole substrate-treating apparatus increase. The increase in the clean room volume and the apparatus case size cause an increase in cost. Specifically, when a high level of cleanness is required, a cost for the apparatus case greatly increases. All ambient air surrounding the substrate-treating apparatus of FIG. 1 are not a clean room air. Instead, the first to sixth modules 2 to 7 (of FIG. 1) may be partially surrounded by a clean room air. Since a substrate is transferred among the first to sixth modules 2 to 7 (of FIG. 1) using the first and second movable transfer chambers 21 and 22 (of FIG. 1), fabrication cost and energy are reduced. The first and second movable transfer chambers 21 and 22 (of FIG. 1) have a pressure condition equal to one of the first to sixth modules 2 to 7 (of FIG. 1) connected to the first and second movable transfer chambers 21 and 22 (of FIG. 1). The pressure condition may be a process vacuum condition in a next module where the substrate is treated. In addition, the first and second movable transfer chambers 21 and 22 (of FIG. 1) may be evacuated while connected to the one of the first to sixth modules 2 to 7 (of FIG. 1).

The size of the first and second movable transfer chambers 21 and 22 is minimized to transfer a substrate promptly. As referring again to FIG. 2, a gate valve 231 including a case 232 is disposed to correspond to the transfer hole 11 of the module 4. The case 232 includes a first flange 233 and the movable transfer chamber 21 includes a second flange 235 corresponding to the first flange 233. The second flange 235 is pulled toward the first flange 233 by a pulling means 234. For example, a collet chuck may be used as a pulling means 234. In addition, a plurality of collet chucks may be disposed at a boundary of the gate valve 231. FIG. 2 shows the movable transfer chamber 21 in a pre-gear position where the movable transfer chamber 21 is spaced apart from the gate valve 231 by the gap distance 230 and in a docking position where the movable transfer chamber 21 contacts the gate valve 231.

The gate valve 231 has a size capable of containing a substrate. For example, the gate valve 231 may have a width of about 1.5 mm corresponding to one side of the substrate. For the purpose of minimizing a volume of the gate valve 231 and perfectly isolating the module 4 and the movable transfer chamber 21 from exterior, the movable transfer chamber 21 includes a first valve 236 having a first valve plate 237. When the movable transfer chamber 21 is separated from the gate valve 231, the first valve plate 237 covers the open portion 225, and an outer surface of the first valve plate 237 and a first docking surface 238 constitute a flat surface. The open portion 225 corresponds to a path hole 239 in the case 232 of the gate valve 231. When the module 4 is separated from the movable transfer chamber 21, a blocking means 240 corresponding to the first valve plate 237 covers the first path hole 239.

The blocking means 240 includes a blocking plate 241, which is rotatable between a second docking surface 242 and a bottom portion of the case 232. The second docking surface 242 is defined by the first and second flanges 233 and 235 at the docking position of the module 4 and the movable transfer chamber 21, and the bottom portion of the case 232 is adjacent to the second docking surface 242. The blocking plate 241 rotates with respect to a rotation axis 243 defined by a shaft 246 of a rotating means (not shown) and parallel to the second docking surface 242. Accordingly, the blocking plate 241 may be alternatively disposed at a close position where the first path hole 239 is covered with the blocking plate 241 and at an open position where the first path hole 239 is open. After the module 4 and the movable transfer chamber 21 are connected to each other, the blocking plate 241 rotates to be disposed at the open position and a substrate transfer path defined by the transfer hole 11 and the open portion 225 is open. FIG. 2 shows a central horizontal surface 244 of the substrate transfer path.

In FIG. 2, the first valve plate 237 is disposed at the close position. For example, the first valve plate 237 may be fixed to the movable transfer chamber 21 using a magnet. At the close position, since an inner pressure of the movable transfer chamber 21 is lower than an outer pressure of the movable transfer chamber 21, the first valve plate 237 may be fixed with a relatively weak force. In another embodiment, other forces may be used for fixing the first valve plate 237 to the movable transfer chamber 21.

When the first valve plate 237 is open, the first valve plate 237 is attached to the blocking plate 241 using a pressure difference. For example, the first valve plate 237 may be sucked using a vacuum to be attached to the blocking plate 241. Accordingly, when the close position of the blocking plate 241 is changed to the open position, the blocking plate 241 and the first valve plate 237 rotate together the gate valve 231 and the movable transfer chamber 21 are open to each other. The blocking plate 241 includes a suction surface 245 for taking the first valve plate 237. The suction surface 245 is connected to an external low pressure source through the shaft 246. Before the substrate transfer path is open by the attachment of the first valve plate 237 to the blocking plate 241, a space at the second docking surface 242 is evacuated. As a result, the substrate transfer path in the module 4 and the movable transfer chamber 21 is not contaminated while the substrate is transferred.

The gate valve 231 further includes a second path hole 247 in the case 232. The second path hole 247 corresponds to the transfer hole 11 of the module 4, and a second valve 248 having a second valve plate 249 is disposed in the second path hole 247. The second valve 248 is alternatively disposed at close and open positions by a control means 250. At the open position, the second valve plate 249 downwardly moves to enter a side room 251 of the case 232 of the gate valve 231 and the blocking plate 240 is disposed over the bottom portion of the case 232 to cover an entrance of the side room 251. Accordingly, during the docking operation of the movable transfer chamber 21 and the module 4, the transfer hole 11 and the second path hole 247 are open due to the second valve 248 before the open portion 225 and the first path hole 239 are open due to the first valve 236.

Volume of the gate valve 231 is minimized due to the first valve 236, the second valve 248 and the blocking plate 240. In addition, since inner spaces of the module 4 and the movable transfer chamber 21 are atmospherically isolated from an external ambient air by the first valve 236, the second valve 248 and the blocking plate 240, structure of the gate valve 231 is simplified. For these purposes, the pressure of the inner spaces is kept lower than the pressure of the ambient air.

Figure 3:
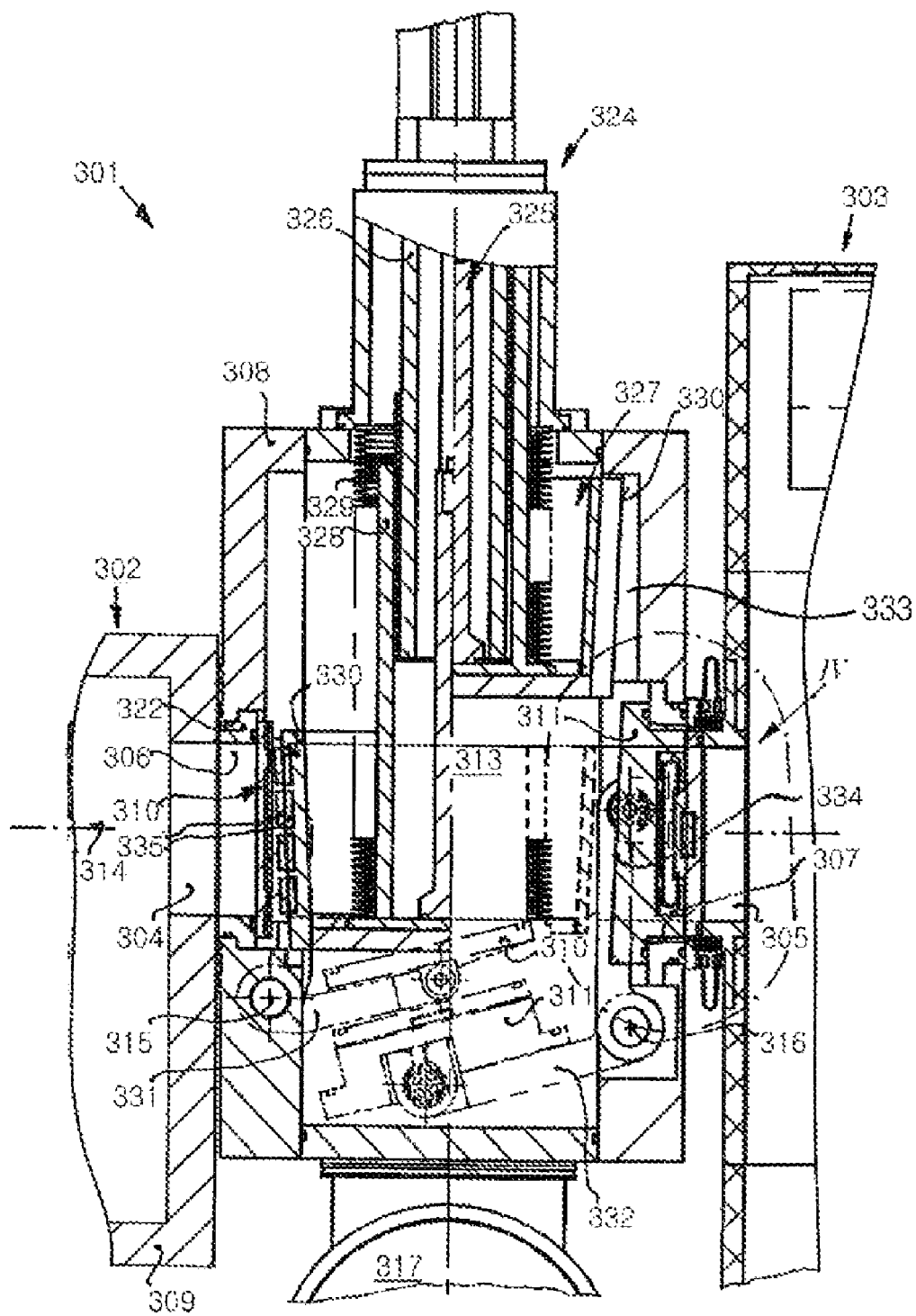
FIG. 3 is a cross-sectional view illustrating a docking operation of a module and a movable transfer chamber using a gate valve according to a third embodiment of the present invention.
Figure 4:
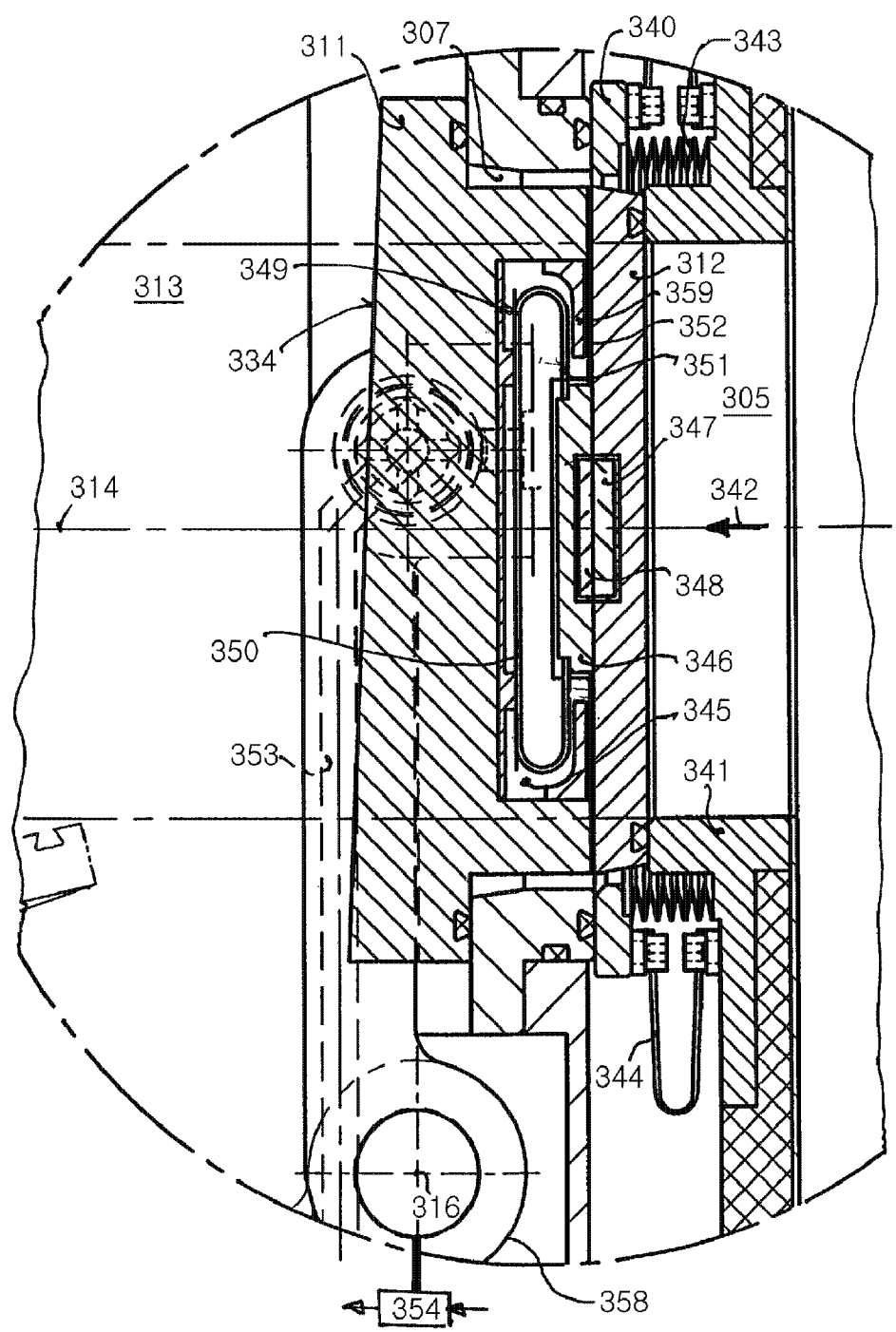
FIG. 4 is a magnified view of a portion "IV" of FIG. 3.
Figure 5:
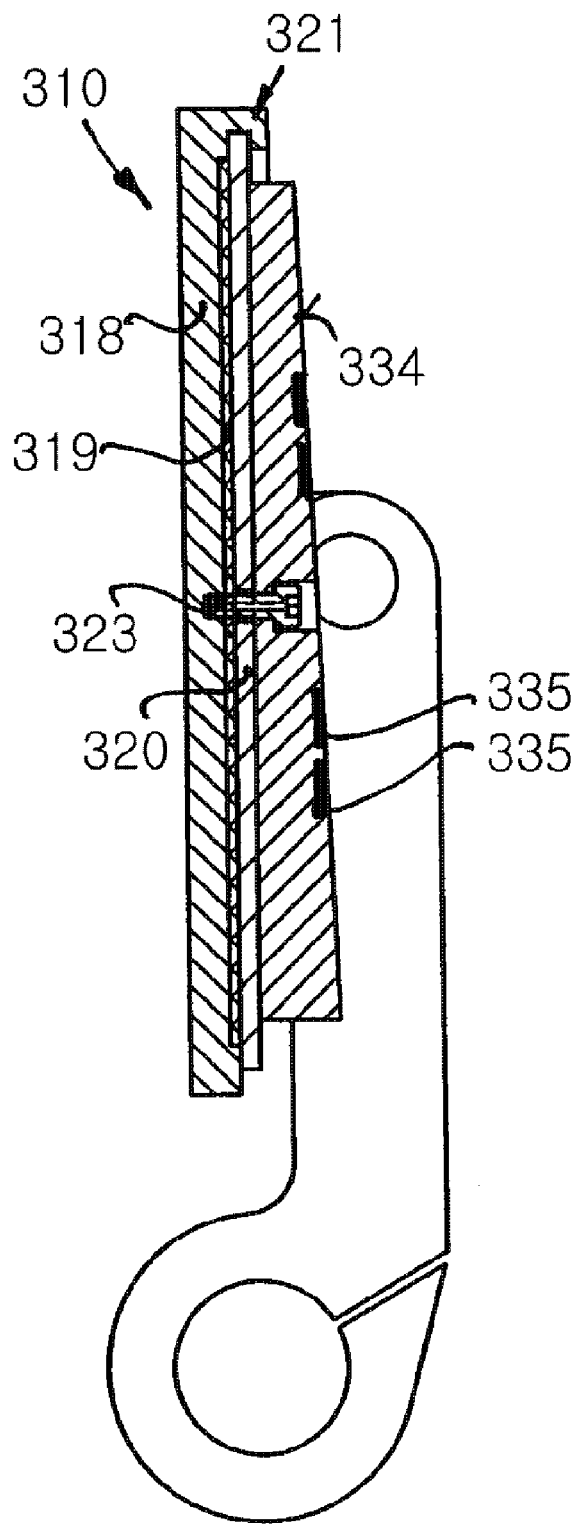
FIG. 5 is an exemplary magnified view of a first blocking plate of FIG. 3.

FIG. 3 is a cross-sectional view illustrating a docking operation of a module and a movable transfer chamber using a gate valve according to a third embodiment of the present invention. In addition, FIG. 4 is a magnified view of a portion "IV" of FIG. 3, and FIG. 5 is an exemplary magnified view of a first blocking plate of FIG. 3. For convenience of illustration, FIG. 3 shows close and open states of a module 302 representing a module unit of a substrate-treating apparatus and a movable transfer chamber 303 representing a transfer unit of a substrate-treating apparatus. The docking operation may be applied to a connection between the other module and the other movable transfer chamber.

In FIG. 3, a gate valve 301 is disposed between a module 302 and a movable transfer chamber 303. The module 302 and the movable transfer chamber 303 are open and close to each other with atmospherically isolated from exterior using the gate valve 301. In addition, during the docking operation, contamination is prevented due to the gate valve 301. The module 302 includes a transfer hole 304 and the movable transfer chamber 303 includes an open portion 305. The gate valve 301 includes a case 308 having first and second path holes 306 and 307. The first and second path holes 306 and 307 correspond to the transfer hole 304 and the open portion 305, respectively. The transfer hole 304 and the open portion 305 are substantially the same as the first and second path holes 306 and 307, respectively, in state and size. In addition, the first and second path holes 306 and 307 may be closed by first and second blocking plates 310 and 311, respectively. The first and second blocking plates 310 and 311 may independently rotate in the case 308. Since the gate valve 301 is fixed to an outer surface 309 of the module 302, a substrate transfer path in the module 302 and the gate valve 301 may be closed by the first blocking plate 310.

When the module 302 and the movable transfer chamber 303 are separated from each other, the second path hole 307 of the case 308 of the gate valve 301 and the open portion 305 of the movable transfer chamber 303 are closed to keep the pressure conditions of the module 302 and the movable transfer chamber 303. In order to keep the inner spaces of the module 302 and the movable transfer chamber 303 atmospherically isolated from exterior when separated, a valve plate 312 covers the open portion 305 and the second blocking plate 311 covers the second path hole 307. Similarly to the second blocking plate 311, the valve plate 312 rotates in an inner space 313 of the gate valve 301 to open the open portion 305.

The first and second blocking plates 310 and 311 are disposed inside the first and second path holes 306 and 307, respectively. In addition, the first and second blocking plates 310 and 311 downwardly rotate in the inner space 313 of the gate valve 301 with respect to the first and second rotation axes 315 and 316, respectively, parallel to a connection surface of the gate valve 301 and the movable transfer chamber 303. For example, the second blocking plate 311 may be open prior to and closed posterior to the first blocking plate 310. Accordingly, when a substrate transfer path is generated in the module 302, the gate valve 302 and the movable transfer chamber 303, the second blocking plate 311 may be disposed under the first blocking plate 310. The inner space 313 of the gate valve 301 may be connected to an external pumping unit 317, and the gate valve 301 may be evacuated by the external pumping unit 317 before the first blocking plate 310 is open.

In addition, the inner space 313 of the gate valve 301 and the module 302 may be evacuated by the external pumping unit 317 before the second blocking plate 311 is open. Accordingly, contamination source such as particles and gases may be eliminated from the first blocking plate 310 and the inner space 313 before a substrate is transferred to the movable transfer chamber 303.

As shown in FIG. 5, the first blocking plate 310 includes a front plate 318, an insulating layer 319, a supporting layer 320 and a rear plate 334. The insulating layer 319 may shield a heat from a high temperature process in the module 302 and support the front plate 318. The front plate 318 is fixed to an edge portion 321 of the supporting layer 320. For example, the front plate 318 may wrap the edge portion of the supporting layer 320 to prevent heat expansion and warpage of the front plate 318. In addition, the front plate 318 may be spaced apart from a frame 322 of the first path hole 306 regardless of high pressure in an atmospherically isolated apparatus. The front plate 318 may be fixed to the supporting layer 320 using a screw combined to a screw hole 323 of the front plate 318.

The first and second blocking plates 310 and 311 are supported by each other through a propping means 324. Since forces are transmitted without a continuous contact by the propping means 324, contamination due to abrasion is prevented. Function of the propping means 324 does not depend on shapes of the first path hole 306, the second path hole 307, the transfer hole 304 and the open portion 305, for example, a rectangular shape for transferring a large-sized substrate of about several square meters. The propping means 324 includes a pair of first control cylinders 325, a guide jacket 326, a guide tube 328 and a propping body 327. The guide jacket 326 surrounds the first control cylinder 325, and the propping body 327 is connected to the guide jacket 326 through the guide tube 328 using a roller. The propping body 327 has a taper shape when viewed in a cross-section and includes a sidewall 330. The first control cylinder 325 is vertically disposed to be spaced apart from a horizontal center surface 314 of the first and second path holes 306 and 307. In addition, the first control cylinder 325 moves the propping body 327. The guide tube 328 extends from a bottom of the propping body 327 and a first wrinkled connection means 329 surrounds the guide tube 328. Accordingly, the guide tube 328 of the propping means 324 is atmospherically isolated from the inner space 313 of the gate valve 301.

When the first and second blocking plates 310 and 311 are disposed at a close position, the propping body 327 moves down to correspond to the first and second blocking plates 310 and 311 connected to first and second rotation levers 331 and 332. The slant sidewall 330 of the propping body 327 is spaced apart from a sidewall of the case 308 by a gap 333 at a top position of the sidewall 330. Accordingly, the sidewall 330 of the propping body 327 is spaced apart from and parallel to the rear plate 334 of the first and second blocking plates 310 and 311 at a bottom portion of the sidewall 330. At the close position, the propping body 327 supplies a force to the first and second blocking plates 310 and 311 to keep the close position without direct contact. For example, the propping body 327 may push the first and second blocking plates 310 and 311 using a magnet 335. The magnet 335 may be disposed on the rear plate 334 of the first and second blocking plates 310 and 311 and on the sidewall 330 of the propping body 327 such that equal polarities face each other. Accordingly, a repulsive force is generated between the rear plate 334 and the sidewall 330 when the propping body 327 is disposed at the bottom position. A permanent magnet may be used as a magnet. A plurality of permanent magnets may be slantingly disposed to be parallel to the sidewall 330 and the rear plate 334. Accordingly, a strong repulsive force is supplied to the first and second blocking plates 310 and 311 at the close position before the movable transfer chamber 303 is connected to the module 302.

Figure 6:
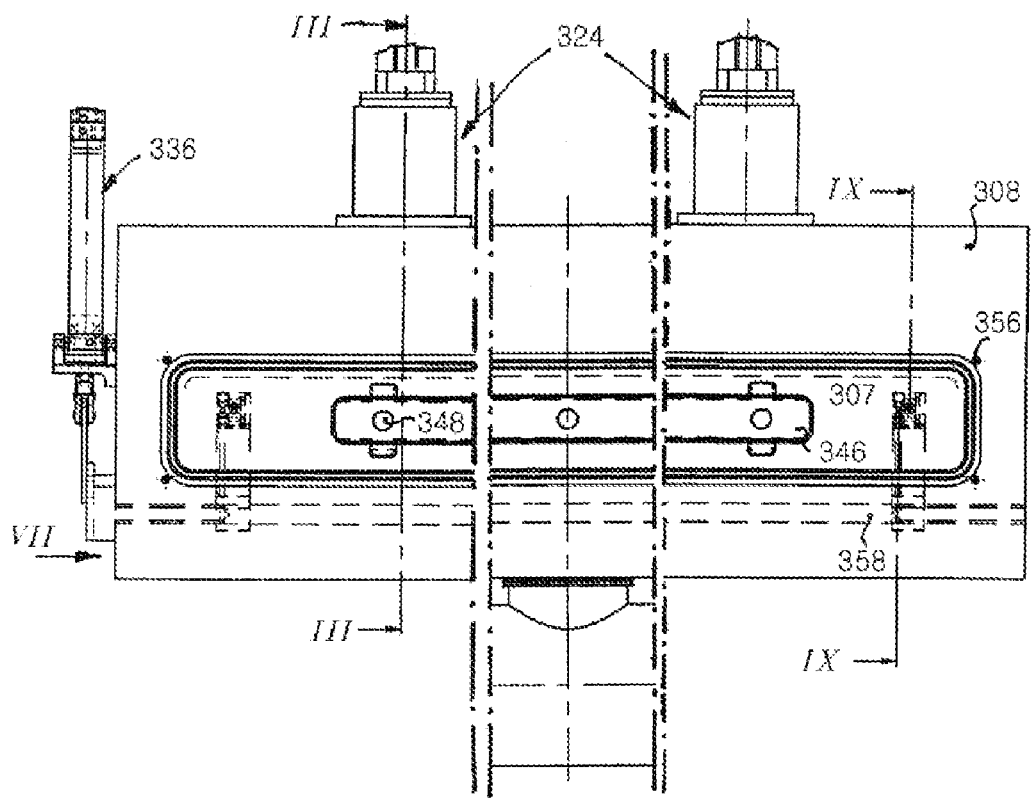
FIG. 6 is a side view of a gate valve viewed from a movable transfer chamber for a substrate-treating apparatus according to a third embodiment of the present invention.
Figure 7:
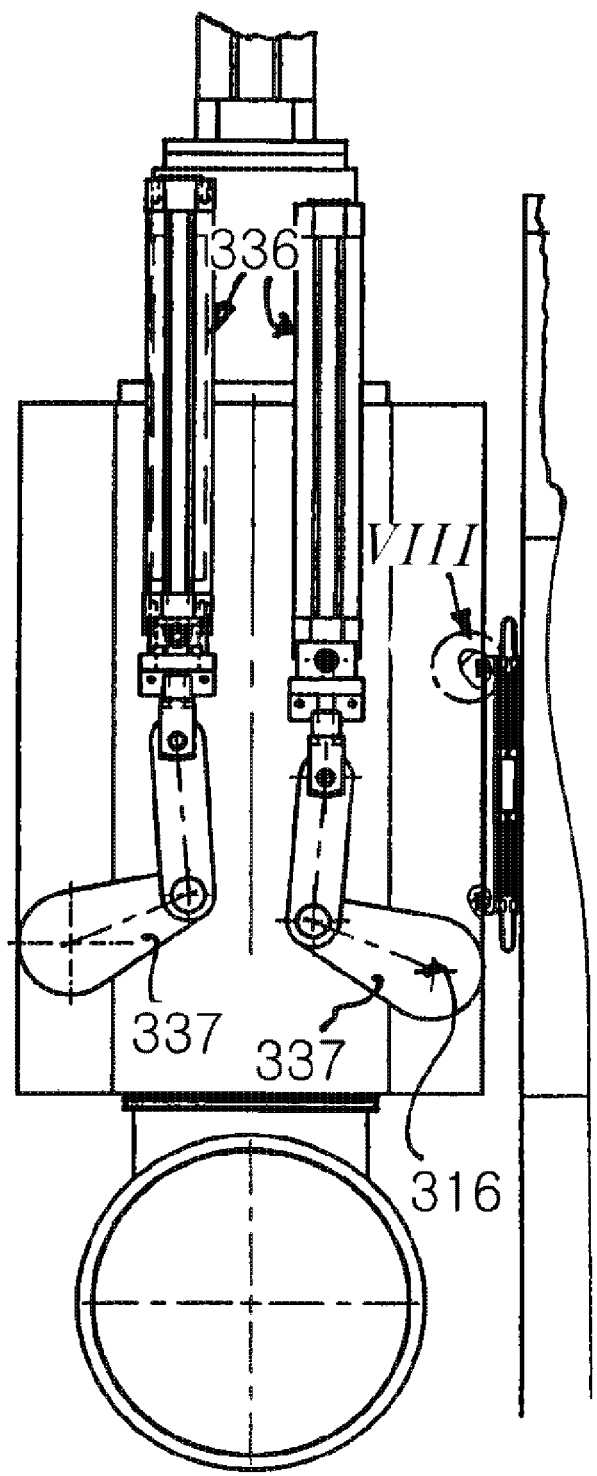
FIG. 7 is a side view of a gate valve viewed from a portion "VII" of FIG. 6.
Figure 8:
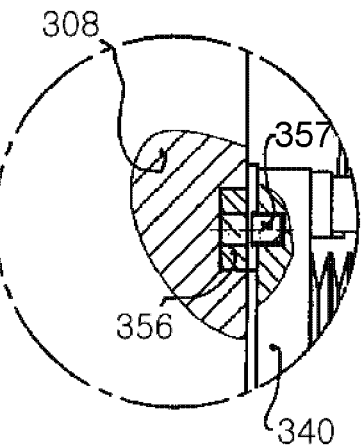
FIG. 8 is a magnified view of a portion "VIII" of FIG. 7.
Figure 9:
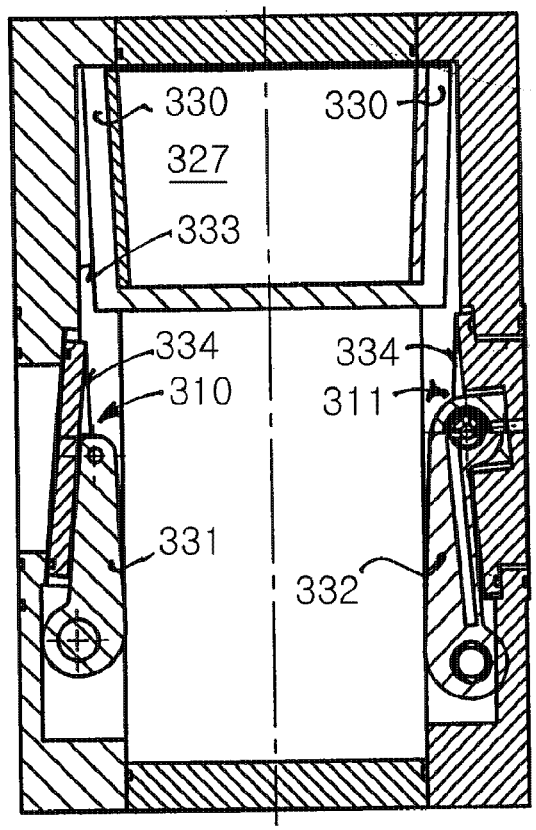
FIG. 9 is a cross-sectional view taken along a line "IX-IX" of FIG. 6.

FIG. 6 is a side view of a gate valve viewed from a movable transfer chamber for a substrate-treating apparatus according to a third embodiment of the present invention, and FIG. 7 is a side view of a gate valve viewed from a portion "VII" of FIG. 6. In addition, FIG. 8 is a magnified view of a portion "VIII" of FIG. 7, and FIG. 9 is a cross-sectional view taken along a line "IX-IX" of FIG. 6. FIG. 7 illustrates an operation of first and second blocking plates 310 and 311, and FIG. 3 is taken along a line "III-III" of FIG. 6.

As shown in FIGS. 6 and 7, the first and second blocking plates 310 and 311 (of FIG. 3) are driven by a pair of second control cylinders 336 disposed outside the case 308 of the gate valve 301. The second control cylinder 336 is connected to a turnabout lever 337 connected to one of the first and second blocking plates 310 and 311. Accordingly, the pair of second control cylinders 336 rotate the turnabout levers 337 along opposite directions with respect to a rotation axis, thereby rotating the first and second blocking plates 310 and 311 oppositely.

Minimization of contamination and damage during the docking of the case 308 of the gate valve 301 and the movable transfer chamber 303 is required. Accordingly, it is necessary to prevent a breakage at portions near the open portion 305 of the movable transfer chamber 303 and the second path hole 307 of the case 308 regardless of a total area of the sidewall of the movable transfer chamber 303 contacting the case 308.

As shown in FIGS. 4, 7 and 8, the movable transfer chamber 303 includes a lens 340 at a boundary of the open portion 305 to reduce misalignment of the docking and impact to the gate valve 301 by the movable transfer chamber 303. The lens 340 is disposed on a front frame 341 of the movable transfer chamber 303 facing the gate valve 301 in a forwarding direction 342, and surrounds the valve plate 312 closing the movable transfer chamber 303. The valve plate 312 closely contacts the front frame 341 of the movable transfer chamber 303 so that the module 302 and the gate valve can be atmospherically isolated from exterior. The lens 340 closely contacts and is elastically supported by the front frame 341 using a second wrinkled connection means 343. Further, the front frame 341 and the lens 340 are connected to each other through an arm spring 344. The arm spring 344 is disposed outside the front frame 341 to correspond to the lens 340.

The second blocking plate 311 includes a cavity 345 corresponding to the valve plate 312, and a supporting board 346 is formed in the cavity 345 to absorb an impact along the forwarding direction. The supporting board 346 may be elastically connected to the cavity 345 through a clamp spring 349. The clamp spring 349 includes a clamp body 350 fixed to a bottom of the cavity 345 and a clamp arm 351 extending from the clamp body 350. The clamp arm 351 may be bent along opposite directions, and one end of the clamp arm 351 is fixed to the supporting board 346. First and second adhesion magnets 347 and 348 are disposed on the valve plate 312 and the supporting board 346, respectively. The valve plate 312 and the supporting board 346 are attached to each other using the first and second adhesion magnets 347 and 348.

As shown in FIG. 4, when the second blocking plate 311 is disposed at the close position, the second blocking plate 311 contacts an inner surface of the case 308 of the gate valve 301 to isolate the gate valve 301 atmospherically from exterior. In addition, a portion of the second blocking plate 311 fills the second path hole 307. The valve plate 312 contacts the front frame 341 of the movable transfer chamber 303 to isolate the movable transfer chamber 303 atmospherically from exterior. The lens 340 elastically supported by the front frame 341 contacts the case 308 of the gate valve 301. Further, the supporting board 346 for the valve plate 312 is disposed to face the front frame 341. A load applied to the supporting board 346 is absorbed by the clamp spring 349 connected to the supporting board 346.

Before the close position, the supporting board 346 is disposed to contact the second blocking plate 311 at front of the clamp arm 351. Since the second blocking plate 311 includes a concave portion 359 corresponding to a boundary of the cavity 345, ambient air are diffused into the cavity 345 through a gap portion 352 between the gate valve 301 and the movable transfer chamber 303 as the disposition to the close position begins. Next, the gap portion 352 is closed by the lens 340, and then a vacuum condition is obtained in the cavity 345 and the gap portion 352 by evacuating the cavity 345 through an exhaust tube 353 before the second blocking plate 311 is open. The exhaust tube 353 may be formed in the second rotation lever 332 for the second blocking plate 311. The ambient air in the cavity 345 may be exhausted through a drive shaft 358 having a tube shape and disposed at the second rotation axis 316 for rotation of the second blocking plate 311. In addition, a control valve 354 may be connected to the drive shaft 358 to adjust an exhaust degree.

The gap portion 352 may be determined by a size of the second blocking plate 311, a lock depth of the second blocking plate 311 and the case 308 and a thickness of the valve plate 312. The clamp spring 349 supporting the valve plate 312 absorbs a load applied to the valve plate 312.

As shown in FIGS. 3 to 9, the first and second blocking plates 310 and 311 are connected to the first and second rotation levers 331 and 332, respectively. The first and second blocking plates 310 and 311 rotate to change facing directions.

At the close position, since the clamp spring 349 pushes the supporting board 346 by an elastic force, the valve plate 312 is pushed toward the front frame 341 by the supporting board 346. When the second blocking plate 311 is open, the cavity 345 has lower pressure than the movable transfer chamber 303. Accordingly, the supporting board 346 and the valve plate 312 are pushed together toward the inner space 313 of the gate valve 301 due to a pressure difference regardless of the elastic force of the clamp spring 349. As a result, the second blocking plate 311 and the valve plate 312 rotates together. An elastic force of a spring unit such as the clamp spring 349 having the clamp arm 351 may be limited by a stopping unit fixed to the valve plate 312.

As shown in FIGS. 6 and 8, a first magnet 356 is formed at a boundary of the second path hole 307 of the gate valve 301. The first magnet 356 may have a rectangular band shape of twofold. In addition, a second magnet 357 is formed in the lens 340 corresponding to the second path hole 307 when the movable transfer chamber 303 is connected to the gate valve 301. The first and second magnets 356 and 357 have equal polarities. Since the lens 340 is elastically supported by the front frame 341 of the movable transfer chamber 303, the case 308 of the gate valve 301 and the front frame 341 of the movable transfer chamber 303 may be aligned by aligning the first and second magnets 356 and 357. Further, the module 302 and the movable transfer chamber 303 may be atmospherically isolated even when the module 302 and the movable transfer chamber 303 are slightly misaligned. As shown in FIG. 6, the second magnet 357 on the movable transfer chamber 303 covers a center of the twofold of the first magnet 356 on the gate valve 301. In addition, the first and second magnets 356 and 357 are spaced apart from each other as shown in FIG. 8.

A contamination due to an ambient air is prevented using the gate valve 301 during the docking operation of the movable transfer chamber 303 and the gate valve 301. Specifically, when the movable transfer chamber 303 is connected to the gate valve 301, it is preferable that a clean air is injected through the exhaust tube 353. Accordingly, after a clean gas such as an inert gas is injected into the cavity 345 and the gap portion 352 for purge, the case 308 and the lens 340 contact each other to be atmospherically isolated from exterior. Next, the cavity 345 and the gap portion 352 are evacuated through the exhaust tube 353 to obtain a vacuum condition. The exhaust tube 353 is used as an injection pipe and an exhaust pipe. As a result, the valve plate 312 rotates with the second blocking plate 311 for the open position because the valve plate 312 is stably attached to the second blocking plate 311 by the vacuum.

The gate valve according to the present invention has advantages especially in a substrate-treating apparatus including a movable transfer chamber. Further, the gate valve according to the present invention may be used in an apparatus including a detachable module for supply, maintenance and management. The gate valve according to the present invention may be applied to connection between modules having different sizes.

Elements of the gate valve according to the present invention may be individually used. For example, the blocking plate may be used alone for shield, or the blocking plate and the valve plate may be used together for support. Further, the blocking plate and the lens may be used together for alignment.

In the present invention, lens is used for prompt and stable connection of detached units. When the detached units are re-connected, the lens is aligned to a connection surface by disposing magnets having the same polarities to face each other.

Consequently, the substrate-treating apparatus according to the present invention treats a large-sized substrate under a high vacuum condition with a minimized energy using a movable transfer chamber. In addition, a process time and a process space are effectively used due to the minimization of transfer time and a structural simplification of the movable transfer chamber. Moreover, the substrate is transferred under a high vacuum condition without a case wrapping the whole apparatus or without a clean room surrounding the apparatus by using the movable transfer chamber surrounding the substrate.

It will be apparent to those skilled in the art that various modifications and variations can be made in a substrate-treating apparatus including a movable transfer chamber without departing from the spirit or scope of the invention. Thus, it is intended that the present invention covers the modifications and variations of this invention provided they come within the scope of the appended claims and their equivalents.

What is claimed is:

1. A substrate-treating apparatus, comprising:
a plurality of modules disposed along a first direction, each of the plurality of modules having an inner space for containing a substrate;
a transfer unit for transferring the substrate among the plurality of modules, the transfer unit including first and second tracks disposed along the first direction on a horizontal plane and first and second movable transfer chambers for moving along the first and second tracks; and
a gate valve fixed to each of the plurality of modules and combined with one of the first and second movable transfer chambers,
wherein the first and second movable transfer chambers are isolated from an exterior atmosphere while moving,
wherein the first movable transfer chamber is adapted to move under the second movable transfer chamber,
wherein the first and second movable transfer chambers are adapted to move parallel with the horizontal plane,
wherein the first and second movable transfer chambers overlap each other in plan view, wherein the first and second movable transfer chambers move parallel with the horizontal plane along the first and second tracks, respectively, such that the first and second movable transfer chambers are connected to corresponding ones of the plurality of modules without breaking a pressure condition, and
wherein each of the plurality of modules includes a transfer hole, wherein each of the first and second movable transfer chambers includes an open portion corresponding to the transfer hole and a first valve for opening and closing the open portion, and wherein the gate valve includes a second valve for opening and closing the transfer hole, a first blocking means corresponding to the first valve, and a second blocking means corresponding to the second valve for opening and closing the transfer hole, and a propping means for supporting the first and second blocking means to close the transfer hole and the open portion without direct contact.

2. The apparatus according to claim 1, wherein the first and second movable transfer chambers are capable of independently moving along the first and second tracks, respectively.

3. The apparatus according to claim 1, wherein the plurality of modules include a plurality of transfer holes, respectively, and wherein the plurality of transfer holes have first and second groups each having a different height.

4. The apparatus according to claim 1, wherein the first and second movable transfer chambers are supported by first and second guide slides, respectively, and the first and second guide slides are disposed on the first and second tracks, respectively.

5. The apparatus according to claim 4, wherein heights of the first and second movable transfer chambers with respect to the heights of the plurality of modules are adjustable by the first and second guide slides, respectively.

6. The apparatus according to claim 4, wherein the first movable chamber extended from the first guide is adapted to slide to the first track.

7. The apparatus according to claim 4, wherein a sub carrier is disposed on the second slide, and the sub carrier includes a supporting plate extended toward the plurality of modules.

8. The apparatus according to claim 7, wherein the sub carrier has a U shaped path so that the first movable chamber moves under the second movable chamber.

9. The apparatus according to claim 1, wherein the first and second blocking means include first and second blocking plates, respectively, rotatable in an inner space of the gate valve, wherein the second blocking plate defines the second valve.

10. The apparatus according to claim 9, wherein the first and second blocking plates are disposed to overlap with each other when the gate valve and the movable transfer chamber are combined.

11. The apparatus according to claim 9, wherein the propping means includes a propping body having a sidewall corresponding to the first and second blocking plates.

12. The apparatus according to claim 11, wherein the sidewall of the propping body includes a plurality of first magnets and rear surfaces of the first and second blocking plates facing the sidewall include a plurality of second magnets, the plurality of first magnets having an opposite polarity to the plurality of second magnets.

13. The apparatus according to claim 1, wherein each of the first and second transfer chambers includes a lens at a boundary of the open portion facing the gate valve.

14. The apparatus according to claim 13, wherein the lens is elastically supported by the first and second movable transfer chambers.

15. The apparatus according to claim 14, wherein the lens is connected to each of the first and second movable transfer chambers through a wrinkled connection means.

16. The apparatus according to claim 15, wherein the gate valve includes a first magnet having two layers, and wherein the lens includes a second magnet corresponding to and having the same polarity as the first magnet.

17. The apparatus according to claim 13, wherein a gap portion between the lens and the gate valve is purged before and after the gate valve and one of the first and second movable transfer chambers are combined.

18. The apparatus according to claim 17, wherein the gap portion is purged using the second blocking means.

\* \* \* \* \*